US006963209B1

(12) United States Patent  (10) Patent No.: US 6,963,209 B1
Gailus et al.  (45) Date of Patent: Nov. 8, 2005

(54) APPARATUS AND METHOD FOR CALIBRATING EQUIPMENT FOR HIGH FREQUENCY MEASUREMENTS

(75) Inventors: Mark W. Gailus, Somerville, MA (US); Marc B. Cartier, Jr., Dover, NH (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/897,638

(22) Filed: Jul. 23, 2004

(51) Int. Cl.[7] ............................................. G01R 31/02
(52) U.S. Cl. ................................. 324/755; 324/158.1
(58) Field of Search ................................ 324/754–755, 324/761–762, 158.1; 174/33, 255, 260–262, 174/266–268, 258; 361/748, 751, 785

(56) References Cited

U.S. PATENT DOCUMENTS

| | | | | |
|---|---|---|---|---|
| 5,363,280 A | * | 11/1994 | Chobot et al. | ............... 361/794 |
| 5,719,750 A | * | 2/1998 | Iwane | ......................... 361/794 |
| 6,084,779 A | * | 7/2000 | Fang | ........................... 361/763 |
| 6,392,160 B1 | * | 5/2002 | Andry et al. | ................ 174/261 |
| 6,452,379 B1 | | 9/2002 | Cartier | |
| 6,639,154 B1 | | 10/2003 | Cartier et al. | |
| 6,717,398 B2 | | 4/2004 | Cartier | |

* cited by examiner

Primary Examiner—Minh N. Tang
(74) Attorney, Agent, or Firm—Wolf, Greenfield & Sacks, PC

(57) ABSTRACT

Calibration standards for accurate high frequency or wide bandwidth calibration measurements. A "short" or "reflect" standard is formed in a printed circuit board from a conductive coating on a generally planar surface. The conductive coating connects a signal trace to one or more ground planes. The generally planar surface is at least as wide as the signal trace and is preferably several times wider than the signal trace to provide a short standard with properties uniform over a wide frequency range. The short standard is incorporated into a printed circuit upon which a device under test is to be mounted. Connections to the short standard are made through components equivalent to components used to connect a device under test. When a through and line standard are added to the same board, the test board contains all the standards needed for a TRL calibration.

25 Claims, 5 Drawing Sheets

APPARATUS AND METHOD FOR CALIBRATING EQUIPMENT FOR HIGH FREQUENCY MEASUREMENTS

BACKGROUND OF INVENTION

1. Field of Invention

This application relates generally to high frequency measurements and more specifically to calibration standards.

2. Discussion of Related Art

In many applications it is desirable to measure the performance characteristics of electronic components. A network analyzer is a piece of test equipment often used for this purpose.

For the measurements made by a network analyzer to accurately reflect the performance of an electronic component, the network analyzer must be calibrated. Calibration is often achieved by attaching devices of known electrical properties, called standards, to the terminals of the network analyzer. By comparing the measurements made by the network analyzer on the known standards to the actual value of the standards, errors in the measurement process can be identified. These errors can be used to compute an adjustment that is applied to each measurement made with the network analyzer.

There are two popular methods for calibrating a network analyzer. One is called the SOLT (Short Open Load Through) method. This approach involves alternatively connecting a calibration standard to each of the terminals that represents a short to ground, an open circuit and a load of known impedance, often a fifty ohm load. In addition, the two ports of the network analyzer are connected together to make the "through" measurement. Taking measurements on these combination of reference standards is sufficient to allow computation of correction factors needed to calibrate the network analyzer.

These measurements are taken at multiple frequencies over the operating range of the network analyzer so that correction values are available for all the frequencies in the operating range. In practice, it is difficult to provide a standard that presents a fifty ohm load across the range of frequencies at which the network analyzer might operate.

The TRL (Through Reflect Line) calibration approach is often used for wide bandwidth or high frequency measurements because it does not require a load standard. The TRL calibration method requires three calibration standards. A "through" standard can be similar to one used in the SOLT approach. Likewise, the "reflect" standard can be the same as the "short" standard used as in the SOLT approach. The line standard is similar to the through standard, but an additional length of line is placed between the two ports of the network analyzer. The characteristics of the line standard depend on the length of line added and the frequency at which measurements are made. Accordingly, multiple line standards are often provided, with each line used to make calibration measurements over a specific range of frequencies (i.e., a specific bandwidth). Measurements taken on the through, reflect and one or more line standards allow computation of correction factors to calibrate the network analyzer.

Calibration in this fashion can compensate for any linear errors in the measurement equipment that are introduced in the signal path that is present when the calibration standards are connected to the network analyzer. The end point in the signal path that is used to connect to the calibration standards is sometimes called the "calibration plane." If additional connectors or circuitry is added beyond the calibration plane while making measurements on a device under test, any errors introduced by these added components are not removed by the calibration process.

To remove errors introduced in the signal path between the calibration plane and the device under test, a process sometimes referred to as "de-embedding" is used. De-embedding involves developing a mathematical model of the components added between the calibration plane and the device under test. Correction factors that compensate out the effect of any such added components are then mathematically computed from the model. These correction factors are applied to any measurements taken by the network analyzer to "de-embed," or mathematically remove, any effect of the components between the calibration plane and the device under test.

An alternative approach that combines calibration and de-embedding in one step is called "calibration through the use of equivalent fixtures." In this approach, calibration standards are mounted in fixtures that are as similar as possible to the fixture used to mount the device under test. When the network analyzer is connected to these standards for calibration measurements, the signal path to the calibration standards has the same properties as the signal path to the device under test. Correction factors computed from measurements made with these calibration standards should also remove any errors introduced in the signal path to the device under test. The calibration plane is effectively at the device under test.

FIG. 1 shows an example of a test set-up that might be used to make performance measurements on a device under test, such as an electrical connector 110. The device under test is connected to a printed circuit board 100. Coaxial connectors such as connector 120 are attached to the board. Traces 130 within printed circuit board 100 connect the co-axial connectors 120 to connector 110.

To measure the performance of electrical connector 110, a network analyzer can be connected to coaxial connectors such as 120. In use, cables running from a network analyzer are connected to the co-axial connectors such as 120.

Before making measurements, calibration standards can be connected to the ends of those same cables. To make calibration measurements using an equivalent fixture approach, reference standards are included on test board 100. These reference standards are connected through traces to coaxial connectors that match, as closely as possible, the signal paths to the device under test. For example, coaxial connectors 140 and 142 are shown joined together by trace 144. Trace 144 might serve as a "through" reference standard and will be twice the length of trace 130. Trace 144 introduces errors that approximate the errors introduced when a signal traverses one of the traces 130 from coaxial connector 120 to a connector 110 and returns back to the network analyzer through another trace. Longer traces similarly configured can provide a "line" standard used for a TRL calibration.

A short or reflect standard might also be incorporated onto printed circuit board 100. FIG. 1 shows a coaxial connector 146 coupled through trace 148 to via hole 150. If via hole 150 is plated through, it will short trace 148 to the ground planes within board 100. Accordingly, it will act as a short circuit to the signal applied through coaxial connector 146.

FIG. 1 shows traces such as 130 as lines on the surface of printed circuit board 100. Art work on the surface of a printed circuit board, such as 100, is often used to make a visually perceptible representation of a trace within the circuit board. However, the actual electrical signals are carried on thin conductive strips, or traces, embedded within the board 100. These traces run between parallel ground planes within circuit board 100, forming stripline transmission lines to carry the signals. The artwork depicted on the surface of the board is intended as an aid in illustrating the underlying structure.

We have recognized that use of a plated through hole such as via 150 does not act as a true short circuit. In particular, we have noted that the plated through hole creates a frequency dependent reactive load, particularly at high frequencies. The problem is most noticeable at frequencies greater than 3 GHz.

SUMMARY OF INVENTION

In one aspect, the invention relates to a printed circuit board having a calibration standards. The printed circuit board includes a ground plane and a signal trace running parallel to the ground plane, a generally planar surface having a width wider than the width of the trace; and a conductive coating disposed on the generally planar surface that makes a direct electrical connection between the trace and the ground plane.

In another aspect, the invention relates to a test fixture for a device under test. The fixture has a position for mounting a device under test, a first separable connector and at least one signal connection path between the position for mounting a device under test and the first separable connector. The board includes a first calibration standard that includes a conductive, generally planar surface; a second separable connector; and a first signal trace electronically connecting the second separable connector and the conductive generally planar surface. A ground plane, parallel to the first signal trace, is electrically connected to the conductive generally planar surface. Also included is a second calibration standard that has a third separable connector; a fourth separable connector; and a second signal trace electrically connected between the third and the fourth separable connectors and parallel to the ground plane, the second signal trace being at least twice as long as the signal connection path.

In yet another aspect, the invention relates to a method of making calibrated measurements on a component mounted to a substrate using a network analyzer. According to the method, the network analyzer is connected to a plurality calibration standards on the substrate through separable connectors, at least one of the calibration standards being a reflect standard including a trace, a ground plane and a generally planar conducting member wider than the trace and disposed on a surface of the substrate, the conducting member connecting the ground plane and the trace. Measurements are made on the plurality of calibration standards with the network analyzer. The network analyzer is connected to the component through separable connectors, and the measurements of the component are adjusted based on measurements made of the calibration standards.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
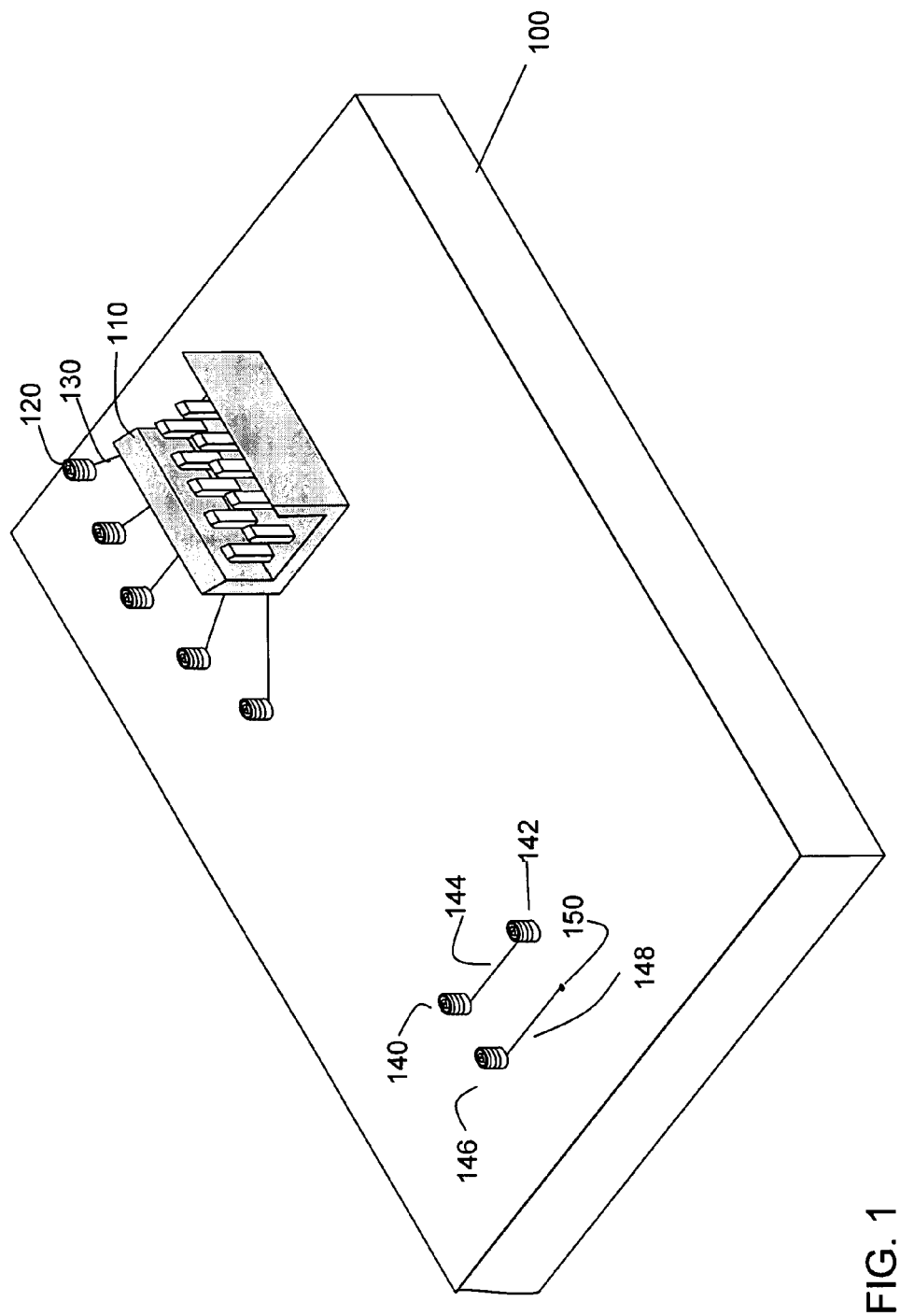
FIG. 1 is a sketch showing a prior art test assembly.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 2:
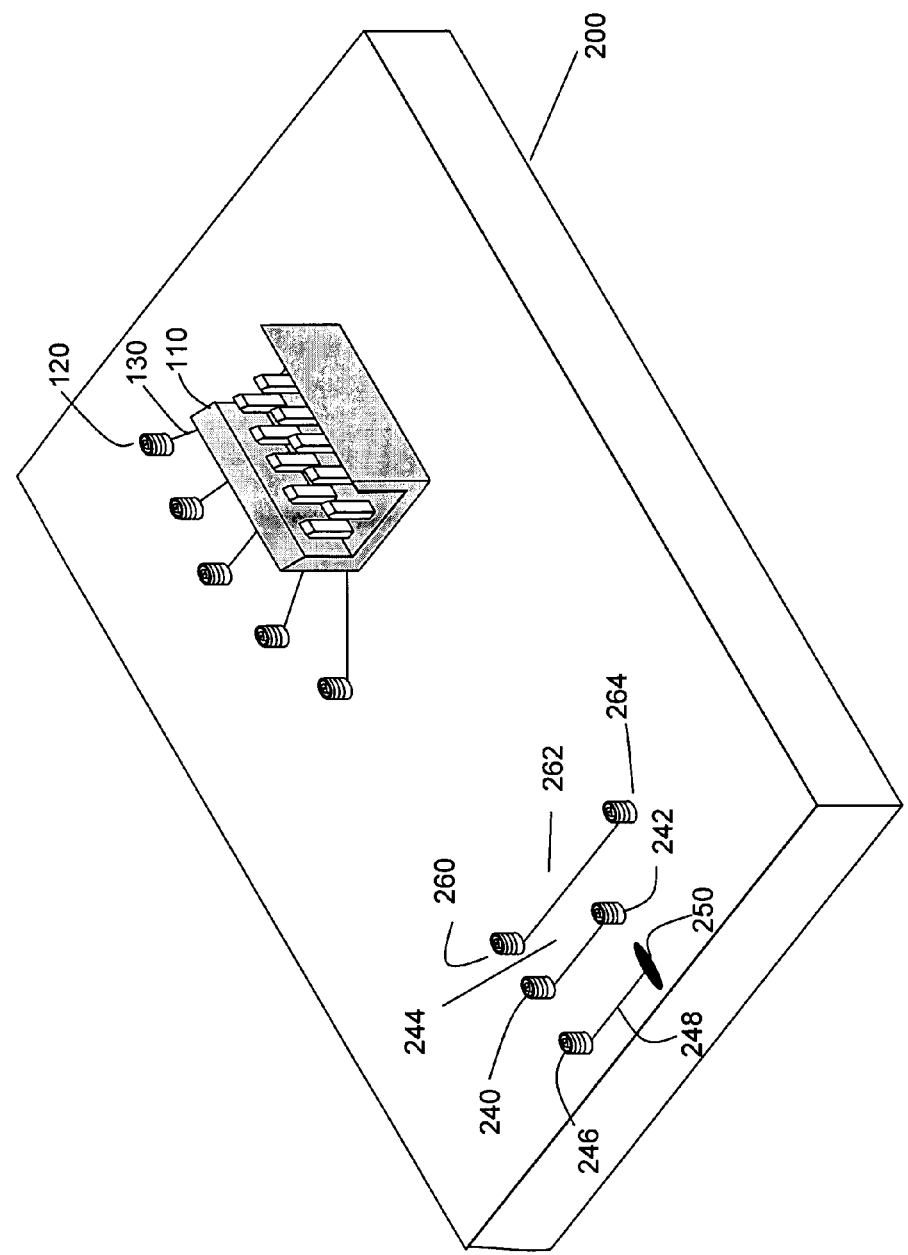
FIG. 2 is a sketch of a test assembly incorporating the invention.

FIG. 2 shows a test board 200 incorporating a device under test, here shown as connector 110. Coaxial connectors such as 120 are connected to the device under test through traces, such as 130 within printed circuit board 200. Test board 200 also includes calibration standards, which are preferably connected through paths within circuit board 200 that have electrical properties that are equivalent to the paths through which signals are coupled to connector 110.

A "through" standard is created by trace 244 connecting coaxial connectors 240 and 242. A line standard is made by trace 262 connecting coaxial connectors 260 and 264.

A short, or "reflect," standard is created by a slot 250 connected through trace 248 to coaxial connector 246. We have discovered that forming a short with a slot such as 250 provides a calibration standard that is very uniform as a function of frequency.

Figure 3B:
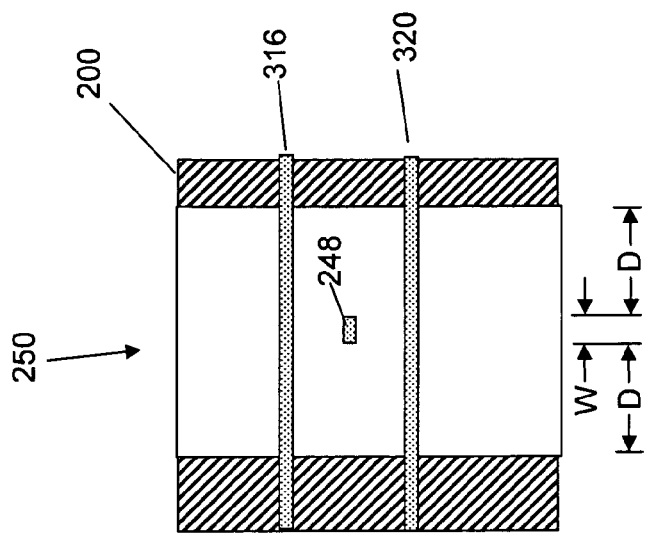
FIG. 3B is a cross section of a portion of the test board of FIG. 3A.
Figure 3A:
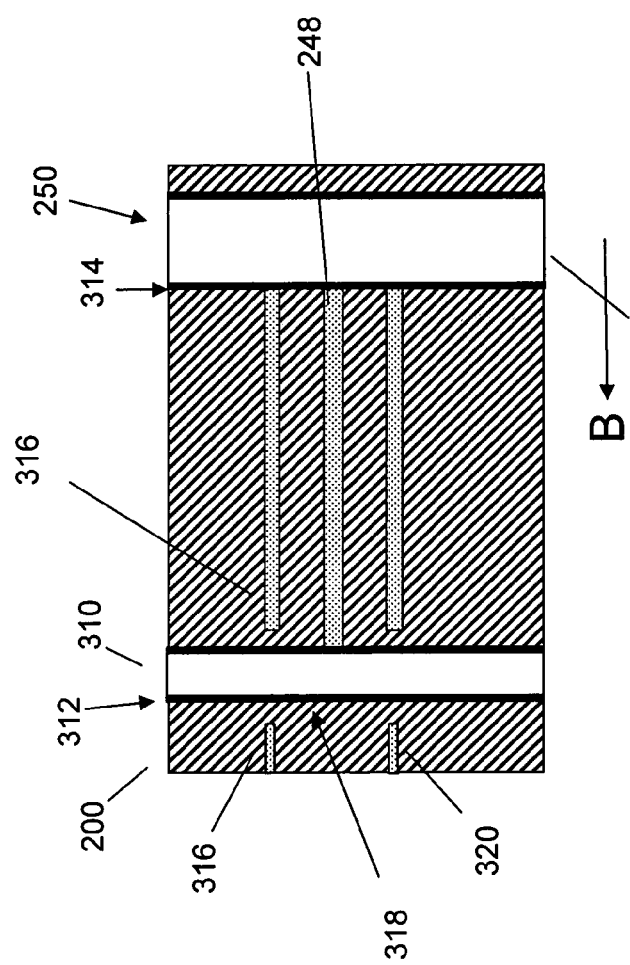
FIG. 3A is a cross section of a portion of the test board in FIG. 2.

FIG. 3A shows in cross section the portion of printed circuit board 200 containing the short calibration standard. Trace 248 is shown within circuit board 200. Trace 248 is between and parallel with ground planes 316 and 320. Via hole 310 connects trace 248 to a coaxial connector such as 246 (FIG. 2).

Coaxial connector 246 is not shown in FIG. 3A. However, coaxial connector 246 maybe connected to printed circuit board 200 such as is shown in U.S. Pat. No. 6,639,154, to Cartier et al., filed Oct. 28, 2003, entitled: APPARATUS FOR FORMING A CONNECTION BETWEEN A CIRCUIT BOARD AND A CONNECTOR, HAVING A SIGNAL LAUNCH, U.S. Pat. No. 6,452,379, to Cartier, U.S., filed Sep. 17, 2002, entitled: METHODS AND APPARATUS FOR CONNECTING TO A SIGNAL LAUNCH, or U.S. Pat. No. 6,717,398, to Cartier, filed Apr. 6, 2004, entitled: SIGNAL LAUNCH CONNECTING TECHNIQUES, all of which are hereby incorporated by reference in their entirety.

Via hole 310 is plated with a conductive coating 312. As is known in the art, this conductive coating can be a metal. As shown in FIG. 3A, trace 248 extends to via 310 and therefore is in electrical contact with conductive coating 312. Ground planes 316 and 320 do not extend to via 310. Ground plane clearance, such as 318, is provided to avoid shorting the ground planes 316 and 320 to trace 248 near via 310.

Slot 250 also has a conductive coating 314. Preferably, coating 314 may be formed at the same time that vias such as 310 are coated. Trace 248 extends to slot 250. Likewise, ground planes 316 and 320 also extend to slot 250. In this way, metal coating 314 shorts trace 248 to ground planes 316 and 320 near slot 250.

Turning to FIG. 3B, slot 250 is shown in cross section from the perspective illustrated as B in FIG. 3A. FIG. 3B indicates that trace 248 has a width W. We have discovered that the electrical properties that slot 250 presents to trace 248 is more uniform as a function of frequency if the wall of slot 250 carrying conductive coating 314 is substantially planar in the vicinity of trace 248. Preferably, the planar regions of metal coating 314 extend a distance D on either side of trace 248. Preferably, the distance D will be at least equal to the width W of trace 248. More preferably, the distance D will equal or exceed twice the width W of trace 248.

Figure 4:
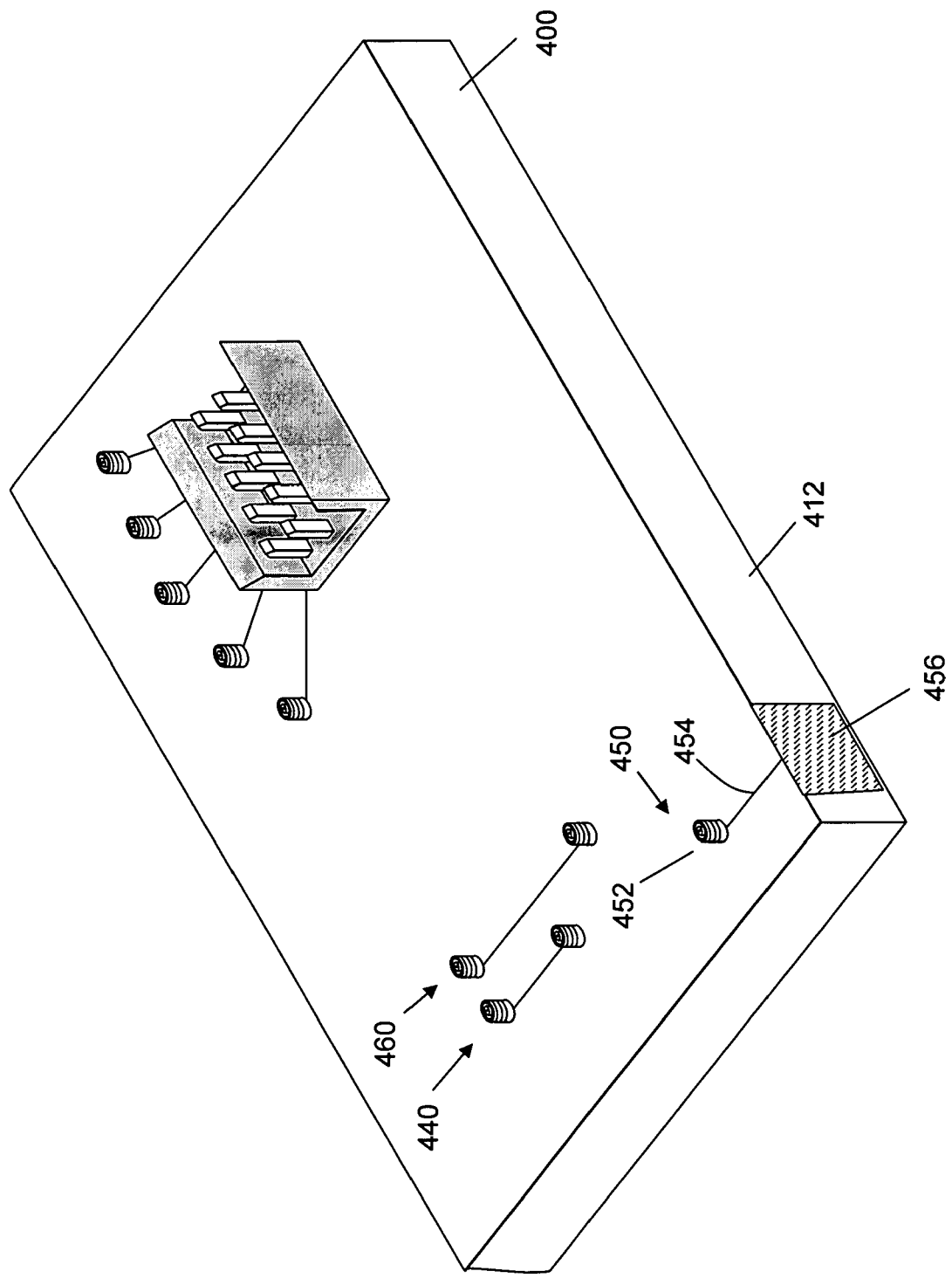
FIG. 4 is a sketch of an alternative embodiment of a test board incorporating the invention.

FIG. 4 shows an alternative embodiment of a test board incorporating an improved short reference standard. Test board 400 includes a through standard 440 and a line standard 460, which can be the same as the reference standards shown in connection with FIG. 2. Reflect standard 450 has similar performance characteristics as the reflect standard shown in FIG. 2.

Coaxial connector 452 couples a signal to trace 454. Trace 454 is terminated in a generally planar conducting member. In the embodiment of FIG. 4, the generally planar conducting member 456 is formed by depositing a conductive material along an edge 412 of printed circuit board 400.

Planar conducting member 456 can be formed in any convenient manner. It might, for example, be formed by depositing metal during the manufacture of printed circuit board 400. Alternatively, insulative portions of circuit board 400 near edge 412 might be etched or otherwise removed to expose the ends of trace 454 and ground planes 316 and 320. Thereafter, conductive member 456 can be applied in any convenient means, such as depositing metal or applying a conductive overlay. As with the embodiment shown in FIG. 3B, it is desirable that the conductive member such as 456 extend a distance D beyond both edges of the trace 454. Preferably, the distance D is grater than or equal to twice the width of trace 454.

Figure 5:
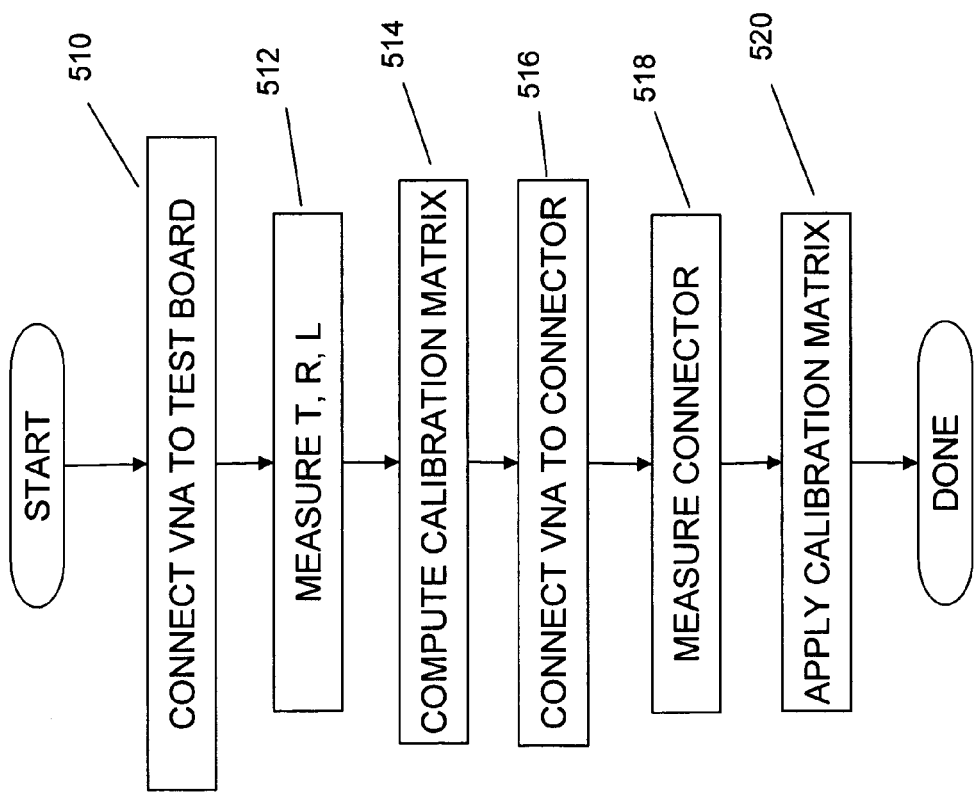
FIG. 5 is a flow chart illustrating the process for calibrating a network analyzer using a test board incorporating the invention.

A test board as described above may be used as part of a process of making calibrated measurements on a component mounted to the test board or other substrate using a network analyzer. FIG. 5 is a flow chart of such a process. At block 510, the network analyzer is connected to a plurality calibration standards on the test board. This connection may be made through separable connectors. At block 512, measurements are made on the plurality of calibration standards with the network analyzer. These measurements may be made in any desired operating range. However, the invention facilitates high frequency measurements, allowing measurements to be made at frequencies in excess of 3 GHz.

At block 514, the measurements are used to compute a calibration. The calibration matrix may be computed according to a process as has been used in the prior art. But, any suitable process, whether now known or hereafter developed, may be used.

At block 516, the network analyzer is connected to the component on which measurements are to be made. In the example illustrated, the component is an electrical connector. The connection may be made through separable connectors. At block 518, measurements are made on the connector or other component being measured. At block 520, the measurements of the component are adjusted based on measurements made of the calibration standards. This correction may be made using a computation as has been used in the prior art, buy any suitable process, whether now known or hereafter developed, may be used.

Having thus described several aspects of at least one embodiment of this invention, it is to be appreciated various alterations, modifications, and improvements will readily occur to those skilled in the art. For example, FIG. 2 shows that slot 250 presents a generally planar surface to the end of trace 248. However, the wall of slot 250 facing trace 248 has a slight amount of curvature to it. While better performance can be achieved by keeping the wall of slot 250 planar for as great a distance as possible beyond the edges of trace 248, significant advantage still can be obtained without a perfectly flat surface. Preferably, though, the walls of slot 250 will have a generally planar portion extending beyond the edge of trace 248 for at least the width of the trace. Further, the wall of slot 250 will preferably not curve out of a plane by more than five percent of the width of the generally planar portion.

The embodiments shown above illustrate a generally planar conductive member in the region of a conductive trace. Other configurations for a conductive member might be employed. Preferably, the conductive member will be symmetrical around the signal trace for at least a distance D in all directions. The distance D is preferably as long as the width of the trace and more preferably at least 2 times the width of the trace. Further, it is preferable that the conductive member be normal to the trace where they intersect.

As another variation, it is possible that the planar surface could be formed as part of a larger structure that is not planar.

FIG. 2 shows slot 250 formed having a major axis and a minor axis with the major axis being substantially longer than the minor axis. Such a configuration is preferred because it provides a compact structure on printed circuit board 200. However, it should be appreciated that a substantially planar portion could be formed from the arc of a circular hole of sufficient radius. However, for a circular hole to provide a generally planar portion, the radius of the hole preferably would be sufficiently large that the generally planar portion extending at least the width of the trace on either side of the trace spanned an arc of the circle of less than 30 degrees and preferably less than 20 degrees.

Circuit boards are shown to have stripline transmission lines. Circuit boards could also be made with microstrip transmission lines.

Such alterations, modifications, and improvements are intended to be part of this disclosure, and are intended to be within the spirit and scope of the invention. Accordingly, the foregoing description and drawings are by way of example only.

What is claimed is:

1. A printed circuit board having a calibration standards, the calibration standard comprising:
   a) a ground plane;
   b) a signal trace running parallel to the ground plane, the trace having a width;
   c) a generally planar surface having a width wider than the width of the trace; and
   d) a conductive coating disposed on the generally planar surface, the conductive coating making a direct electrical connection between the trace and the ground plane.

2. The printed circuit board of claim 1 wherein the generally planar surface is a wall of an opening formed in the printed circuit board.

3. The printed circuit board of claim 2 wherein the generally planar surface extends from the center of the trace for at least the width of the trace in all directions.

4. The printed circuit board of claim 3 wherein the generally planar surface has a non-planarity of less than 5% of the width of the generally planar surface.

5. The printed circuit board of claim 3 wherein the generally planar surface has a curvature of an arc of a circle spanning less than 20 degrees.

6. The printed circuit board of claim 3 wherein the generally planar surface is normal to the ground plane where the generally planar surface intersects the trace.

7. The printed circuit board of claim 3 wherein the generally planar surface is a portion of a non-planar member.

8. The printed circuit board of claim 7 wherein the opening is a slot.

9. The printed circuit board of claim 1 wherein the generally planar surface is a wall bounding an opening in the printed circuit board.

10. The printed circuit board of claim 1 wherein the generally planar surface is an edge of the printed circuit board.

11. The printed circuit board of claim 10 wherein the generally planar surface extends from the center of the trace for at least the width of the trace in all directions.

12. The printed circuit board of claim 11 wherein the generally planar surface has a non-planarity of less than 5% of the width of the generally planar surface.

13. The printed circuit board of claim 11 wherein the generally planar surface has a curvature of an arc of a circle spanning less than 20 degrees.

14. The printed circuit board of claim 11 wherein the generally planar surface is normal to the ground plane where the generally planar surface intersects the trace.

15. The printed circuit board of claim 11 wherein the generally planar surface is a portion of a non-planar member.

16. A test fixture for a device under test comprising:
 a) a position for mounting a device under test;
 b) a first separable connectors;
 c) at least one signal connection path between the position for mounting a device under test and the first separable connector;
 d) a first calibration standard comprising:
  i) a conductive generally planar surface;
  ii) a second separable connector;
  iii) a first signal trace electronically connecting the second separable connector and the conductive generally planar surface;
 e) a ground plane, parallel to the first signal trace, the ground plane electrically connected to the conductive generally planar surface;
 f) a second calibration standard comprising:
  i) a third separable connector;
  ii) a fourth separable connector;
   iii) a second signal trace electrically connected between the third and the fourth separable connectors and parallel to the ground plane, the second signal trace being at least twice as long as the signal connection path.

17. The test fixture of claim 16 additionally comprising a second ground plane parallel to the first signal trace and disposed on an opposite side of the ground plane from the first signal trace.

18. The printed circuit board of claim 16 wherein the generally planar surface extends from the center of the first signal trace for at least the width of the first signal trace in all directions.

19. The printed circuit board of claim 18 wherein the generally planar surface has a non-planarity of less than 5% of the generally planar surface.

20. The printed circuit board of claim 18 wherein the generally planar surface has a curvature of an arc of a circle spanning less than 20 degrees.

21. The printed circuit board of claim 18 wherein the test fixture comprises a printed circuit board and the generally planar surface is formed on a wall of a slot in the printed circuit board.

22. A method of making calibrated measurements on a component mounted to a substrate using a network analyzer, comprising:
 a) connecting the network analyzer to a plurality calibration standards on the substrate through separable connectors, at least one of the calibration standards being a reflect standard including a trace, a ground plane and a generally planar conducting member wider than the trace and disposed on a surface of the substrate, the conducting member connecting the ground plane and the trace;
 b) making measurements on the plurality of calibration standards with the network analyzer;
 c) connecting the network analyzer to the component through separable connectors;
 d) adjusting measurements of the component based on measurements made of the calibration standards.

23. The method of claim 22 wherein the substrate comprises a printed circuit board.

24. The method of claim 23 wherein the component comprises an electrical connector.

25. The method of claim 22 wherein the measurements are made at frequencies in excess of 3 GHz.

* * * * *